United States Patent
Hsieh et al.

(10) Patent No.: US 8,872,345 B2
(45) Date of Patent: Oct. 28, 2014

(54) FORMING GROUNDED THROUGH-SILICON VIAS IN A SEMICONDUCTOR SUBSTRATE

(75) Inventors: Chi-Chun Hsieh, Tonglup Township (TW); Wei-Cheng Wu, Hsinchu (TW); Hsiao-Tsung Yen, Tainan (TW); Hsien-Pin Hu, Zhubei (TW); Shang-Yun Hou, Jubei (TW); Shin-Puu Jeng, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 244 days.

(21) Appl. No.: 13/178,079

(22) Filed: Jul. 7, 2011

(65) Prior Publication Data

US 2013/0009317 A1    Jan. 10, 2013

(51) Int. Cl.
*H01L 23/48* (2006.01)
*H01L 21/283* (2006.01)
*H01L 21/74* (2006.01)

(52) U.S. Cl.
CPC ....... *H01L 23/481* (2013.01); *H01L 2924/0002* (2013.01); *H01L 21/743* (2013.01)
USPC ........... 257/774; 257/751; 438/618; 438/627; 438/667; 438/653

(58) Field of Classification Search
USPC .......... 257/415, E29.324, E21.002, 685–686, 257/750–751, 773–774, 777, E23.085; 438/50
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |

(Continued)

FOREIGN PATENT DOCUMENTS

JP    2005243689    9/2005

*Primary Examiner* — Cuong Q Nguyen
(74) *Attorney, Agent, or Firm* — Lowe Hauptman & Ham, LLP

(57) ABSTRACT

A method of forming an interposer includes providing a semiconductor substrate, the semiconductor substrate having a front surface and a back surface opposite the front surface; forming one or more through-silicon vias (TSVs) extending from the front surface into the semiconductor substrate; forming an inter-layer dielectric (ILD) layer overlying the front surface of the semiconductor substrate and the one or more TSVs; and forming an interconnect structure in the ILD layer, the interconnect structure electrically connecting the one or more TSVs to the semiconductor substrate.

35 Claims, 3 Drawing Sheets

(56) References Cited

U.S. PATENT DOCUMENTS

| | | |
|---|---|---|
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,846,837 B2 * | 12/2010 | Kuo ............... 438/667 |
| 8,299,583 B2 * | 10/2012 | Zhu ............... 257/621 |
| 8,404,587 B2 * | 3/2013 | Kirby et al. ............... 438/667 |
| 2003/0178389 A1 | 9/2003 | Yuasa |
| 2005/0017333 A1 * | 1/2005 | Bohr ............... 257/678 |
| 2007/0184654 A1 * | 8/2007 | Akram et al. ............... 438/675 |
| 2007/0289127 A1 * | 12/2007 | Hurwitz et al. ............... 29/827 |
| 2012/0135566 A1 * | 5/2012 | Pinguet et al. ............... 438/107 |

* cited by examiner

US 8,872,345 B2

FORMING GROUNDED THROUGH-SILICON VIAS IN A SEMICONDUCTOR SUBSTRATE

FIELD

The disclosure relates generally to the fabrication of semiconductor devices and, more particularly, to a method of forming grounded through-silicon vias in a semiconductor substrate.

BACKGROUND

Interposers are used for integrated circuit packaging, typically for space transformation, which is for routing connections between semiconductor dies and packaging components. FIG. 1 illustrates a cross-sectional view of a portion of an interposer 10. Usually, interposer 10 includes a substrate 30, which is typically formed of organic materials or ceramics. One or more through-silicon vias (TSVs) 50 are formed in the substrate 30 for making electrical connections from one or more semiconductor dies and/or packaging components (not shown).

With the increasing scaling down of integrated circuits and increasing circuit functionality there is an increased demand for progressively smaller linewidths on the interposer. As linewidths shrink, RC transmission line effects increase due to loading from die/die package resistance, inductance, and/or capacitance. Moreover, as substrate 30 is not grounded cross coupling or cross talk between adjacent TSVs increases as well. Due to this cross-coupling between TSVs, signals traveling along relatively long interconnections suffer delays and other forms of distortion. As a result, these signals may become corrupted, slowing operation of integrated circuits or even causing failure. These effects are more pronounced as operating frequencies increase.

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 2-6 are cross-sectional views of a portion of an interposer 20 at various stages of fabrication according to an exemplary embodiment of the present disclosure. It is understood that FIGS. 2-6 have been simplified for a better understanding of the inventive concepts of the present disclosure.

Figure 1:
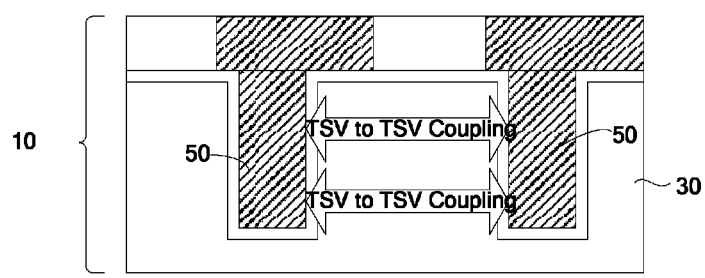
FIG. 1 is a cross-sectional view of a portion of an interposer showing the problem of low signal integrity resulting from TSV to TSV coupling.
Figure 2:
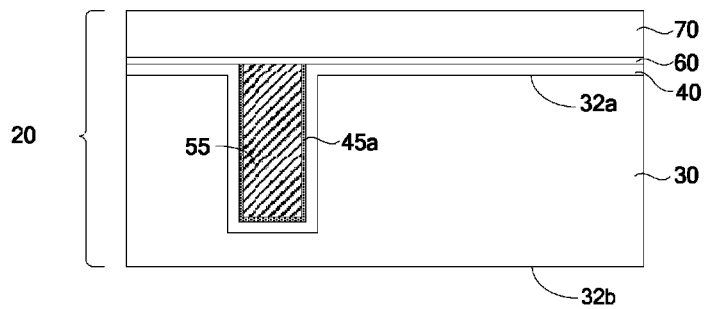
FIGS. 2-6 are cross-sectional views of a portion of an interposer at various stages of fabrication according to an exemplary embodiment of the present disclosure.

Referring to FIG. 2, the interposer 20 includes a substrate 30 having a front surface 32a and a back surface 32b opposite the front surface 32a. Substrate 30 is formed of silicon, although other semiconductor materials including group III, group IV, group V elements and silicon germanium (SiGe) may also be used. In alternative embodiments, substrate 30 contains commonly used materials such as inorganic and organic materials, ceramics, and/or multi-layers thereof.

In an embodiment to form a TSV opening that extends from front surface 32a into a portion of the substrate 30, a photoresist layer (not shown) is spin coated over the front surface 32a of substrate 30. The photoresist layer is then patterned by exposure, bake, development, and/or other photolithography processes using the patterned photoresist layer as a masking element to form the TSV opening passing through a portion of the substrate 30. In some embodiments, the TSV opening may be etched using any suitable etching method including, for example, plasma etch, a chemical wet etch, a laser drill, and/or other suitable processes. In an embodiment, the etching process includes a deep reactive ion etching (RIE) process to etch the substrate 30. The etching process may result in an opening having a vertical sidewall profile or a tapered sidewall profile.

In another embodiment of forming an opening that is a TSV opening, a photoresist layer (not shown) may be formed on a hard mask layer (not shown). The photoresist layer is patterned by exposure, bake, developing, and/or other photolithography processes to provide an opening exposing the hard mask layer. The exposed hard mask layer is then etched, by a wet etch or dry etch process, using the patterned photoresist layer as a masking element to provide an opening. Using the hard mask layer and the patterned photoresist layer as mask elements, an etching process is performed to etch the exposed substrate 30 forming the TSV opening.

A Liner layer 40 is thereafter formed over substrate 30. Liner layer 40 is conformally deposited on the front surface 32a of the substrate 30 and along the sidewalls and bottom of the TSV opening in order to prevent any conducting material from leaching into substrate 30. In some embodiments, the liner layer 40 may be formed of silicon oxide, TEOS (tetraethylorthosilicate) oxide, silicon nitride, polyimide, combinations thereof, or the like. The deposition can be carried out using any of a variety of techniques, including thermal oxidation, LPCVD (low-pressure chemical vapor deposition), APCVD (atmospheric-pressure chemical vapor deposition), PECVD (plasma-enhanced chemical vapor deposition), and other suitable deposition procedures. For example, an LPCVD or PECVD process with TEOS and $O_3$ may be employed to form a TEOS oxide film.

Still referring to FIG. 2, a barrier layer 45a is then formed on the liner layer 40, lining the TSV opening. The barrier layer 45a functions as a diffusion barrier to prevent metal diffusion and as an adhesion layer between metal and dielectric. In some embodiments, refractory metals, refractory metal-nitrides, refractory metal-silicon-nitrides, or combinations thereof are typically used for the barrier layer 45a. For example, TaN, Ta, Ti, TiN, TiSiN, WN, or combinations thereof may be used. In an embodiment, the barrier layer 45a includes a TaN layer and a Ta layer, in another embodiment, the barrier layer 45a is a TiN layer. In yet another embodiment, the barrier layer 45a is a Ti layer. The barrier layer 45a can be formed using PVD (physical vapor deposition), sputtering, or the like. Subsequently, a metal seed layer (not shown) is formed on the barrier layer 45a. In an embodiment, the metal seed layer is a copper seed layer that may be formed by PVD (physical vapor deposition) sputtering, electro plating, or electroless plating. In some embodiments, other methods for forming the copper seed layer, such as CVD (chemical vapor deposition), are used.

Next, a conductive material layer is deposited on the interposer 20 to fill the TSV opening thereby forming a conductive plug 55. Throughout the description, the conductive plug 55 is referred to as a through-silicon-via (TSV). The conductive material layer may include a low resistivity conductor material selected from the group of conductor materials including, but is not limited to, copper and copper-based alloy. In some embodiments, the conductive material layer may comprise various materials, such as tungsten, aluminum, gold, silver, titanium, or the like. The formation methods may include sputtering, printing, electroplating, electroless plating, and/or chemical vapor deposition (CVD) methods.

Subsequently, the excess portions of the conductive material layer outside the ISV opening are removed, either through etching, chemical mechanical polishing (CMP), or the like, having the upper surface of the conductive plug 55 substantially coplanar with the upper surface of the liner layer 40.

One or more etch stop layers 60 may optionally be formed over interposer 20. Generally, the etch stop layers provide a mechanism to stop an etching process when forming vias and/or contacts. In some embodiments etch stop layer 60 is formed of a dielectric material having a different etch selectivity from adjacent layers, e.g., the underlying liner layer 40, the substrate 30, and an overlying ILD layer 70. In an embodiment, etch stop layer 60 may be formed of SiN, SiON, ON, combinations thereof, or the like, deposited by CVD or PECVD techniques.

Still referring to FIG. 2, the inter-layer dielectric (ILD) layer 70 is formed on the front surface 32a of substrate 30 over the liner layer 40 and the etch stop layer 60. The ILD layer 70 isolates the TSV 55 from a subsequent formation of interconnection structure. The ILD layer 70 may be a single layer or a multi-layered structure. In some embodiments, the ILD layer 70 may be a silicon oxide containing layer formed of doped or undoped silicon oxide by a thermal CVD process or high-density plasma (HDP) process, e.g., undoped silicate glass (USG), phosphorous doped silicate glass (PSG) or borophosphosilicate glass (BPSG). In some alternative embodiments, the ILD layer 70 may be formed of doped or P-doped spin-on-glass (SOG), phosphosilicate TEOS (PTEOS), or borophosphosilicate TEOS (BPTEOS).

Figure 3:
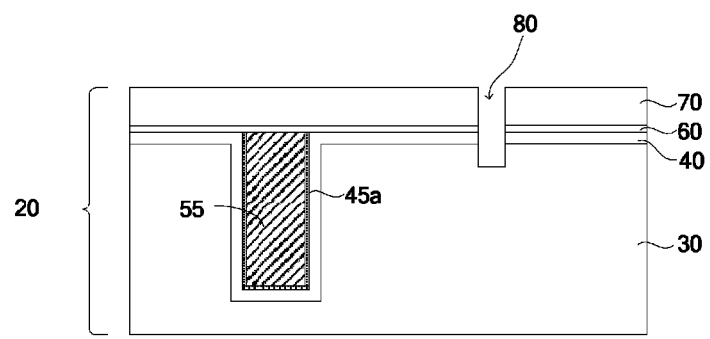

An interconnect structure electrically connecting the ISV with the substrate 30 will now be described with reference to FIGS. 3-6. With reference to FIG. 3, a via opening 80 is formed extending from the ILD layer 70 into a portion of the substrate 30. In some embodiments, via opening 80 may be formed by firstly coating a photoresist layer (not shown) on ILD layer 70. The photoresist layer is then patterned by exposure, bake, development, and/or other photolithography processes using the patterned photoresist layer as a masking element to form the via opening. In some embodiments, the via opening 80 may be etched using any suitable etching method including, for example, a plasma etch, a chemical wet etch, a laser drill, and/or other processes. The etching process may result in an opening having a vertical sidewall profile or a tapered sidewall profile.

In another embodiment of forming an opening that is a via opening, a photoresist layer (not shown) may be formed on a hard mask layer (not shown). The photoresist layer is patterned by exposure, bake, developing, and/or other photolithography processes to provide an opening exposing the hard mask layer. The exposed hard mask layer is then etched, by a wet etch or dry etch process, using the patterned photoresist layer as a masking element to provide an opening. Using the hard mask layer and the patterned photoresist layer as mask elements, an etching process is performed to etch the exposed substrate 30 forming the via opening.

Figure 4:
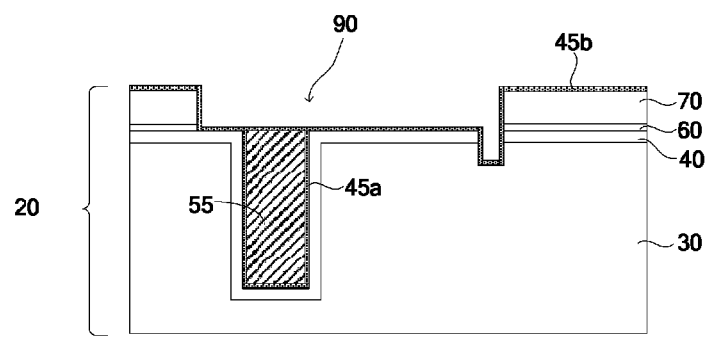

A trench opening 90, shown in FIG. 4, is then formed in the ILD layer 70 in a similar fashion as forming the via opening 80 above and hence the process will not be repeated herein. The trench opening 90 exposes a portion of the TSV 55 so that in a subsequent step a conductive material layer will be deposited on interposer 20, said conductive material layer forming an interconnect structure that connects TSV 55 with substrate 30. A barrier layer 45b may be formed over interposer 20, in the via opening 80 and the trench opening 90. A seed layer (not shown) may be subsequently formed over the barrier layer 45b. Both the materials and processes used for forming the barrier layer 45b and the seed layer was previously described above with reference to FIG. 2 and will therefore not be described again.

Figure 5:
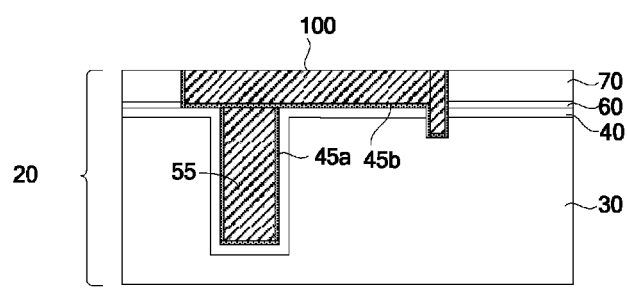
Figure 6:
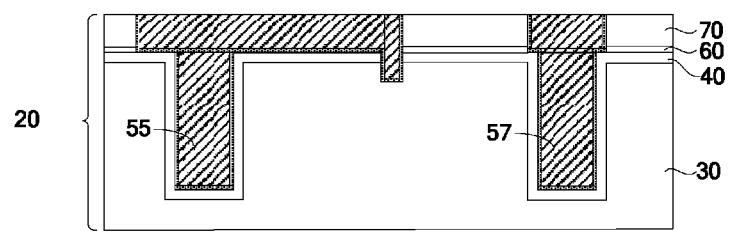

Referring to FIG. 5, the interposer 20 is transferred to a plating tool, such as an electrochemical plating (ECP) tool, and a conductive material layer is plated on the interposer 20 by the plating process to fill the via opening 80 and the trench opening 90 to form an interconnect structure 100. While the ECP process is described therein, the embodiment is not limited to ECP deposited metal. The conductive material layer may include a low resistivity conductor material selected from the group of conductor materials including, but is not limited to, copper and copper-based alloy. In some embodiments, the conductive material layer 80 may comprise various materials, such as tungsten, aluminum, gold, silver, or the like. This electroplating process forms a void-free metallization structure to provide a reliable solution. Other methods for depositing a conductive material layer in via opening 80 and trench opening 90 are also contemplated.

Following the depositing of the conductive material layer, the upper surface of interposer 20 undergoes a planarization step. Excess portions of the conductive material layer outside the via and trench openings are removed, either through etching, chemical mechanical polishing (CMP), or the like, having the upper surface of the interconnect structure 100 substantially coplanar with the upper surface of the ILD layer 70.

Advantageously, interposer 20 may be easily customized to suit different requirements. In an exemplary embodiment, an active or passive device (not shown) is embedded into the interposer 20, wherein the active or passive device may include capacitors, resistors, and the like.

It is understood that additional processes may be performed to complete the fabrication of interposer 20 to form various features for implementation in a semiconductor package structure. Subsequent fabrication processing may further form features such as metal lines, connecting vias, dielectric layers, bonding pads, or solder bumps configured to connect the various features or structures of interposer 20 to one or more semiconductor chips. In an exemplary embodiment, a semiconductor chip can be bonded onto interposer 20 with a plurality of bonding pads. One skilled in the art will realize the corresponding bonding process steps. In another exemplary embodiment, a multi-chip structure having at least two semiconductor chips can be bonded onto interposer 20. According to one embodiment, the at least two chips are bonded together before they are bonded onto interposer 20. Alternatively, a first chip is bonded onto interposer 20 first, and then the second chip is bonded onto the first chip.

According to one embodiment, a method of forming a semiconductor device comprises providing a semiconductor substrate, the semiconductor substrate having a first side and a second side opposite the first side; forming a through-silicon via (TSV) opening extending from the first side of the semiconductor substrate into the semiconductor substrate; forming a liner layer on the first side of the semiconductor substrate and along the sidewalk and bottom of the TSV opening; depositing a first conductive material layer over the liner layer in the opening to form a TSV; forming an inter-layer dielectric (ILD) layer over the first side of the semiconductor substrate; forming a via opening extending from the ILD layer into a portion of the semiconductor substrate; forming a trench opening in the IUD layer to expose a portion of the ISV; and depositing a second conductive material layer in the via and the trench openings to form an interconnect structure, the interconnect structure electrically connecting the TSV with the semiconductor substrate.

According to another embodiment, a method of forming an interposer comprises providing a semiconductor substrate, the semiconductor substrate having a front surface and a back surface opposite the front surface; forming one or more through-silicon vias (TSVs) extending from the front surface into the semiconductor substrate; forming an inter-layer dielectric (ILD) layer overlying the front surface of the semiconductor substrate and the one or more TSVs; and forming an interconnect structure having a first partition and a second partition, the first partition formed in the ILD layer and the second partition formed in a portion of the semiconductor substrate, wherein the interconnect structure electrically connects the one or more TSVs to the semiconductor substrate.

According to yet another embodiment, an integrated circuit structure comprises a semiconductor substrate having a front surface and a hack surface opposite the front surface; a TSV formed extending from the front surface of the semiconductor substrate into the semiconductor substrate; and an interconnect structure having a first partition and a second partition, the first partition formed in an ILD layer, the ILD layer overlying the front surface of the semiconductor substrate and the second partition formed in a portion of the semiconductor substrate, wherein the interconnect structure electrically connects the TSV to the semiconductor substrate.

According to yet another embodiment, an interposer comprises a semiconductor substrate having a front surface and a back surface opposite the front surface; a TSV formed extending from the front surface of the semiconductor substrate into the semiconductor substrate; a liner layer formed at least between the TSV and the semiconductor substrate; an ILD layer formed over the front surface of the semiconductor substrate; and an interconnect structure having a first partition and a second partition, the first partition formed in the ILD layer and the second partition formed in a portion of the semiconductor substrate. Wherein the interconnect structure electrically connects the TSV to the semiconductor substrate.

According to yet still another embodiment, a semiconductor package structure comprises an interposer having a semiconductor substrate having a front surface and a back surface opposite the front surface; a TSV formed extending from the front surface of the semiconductor substrate into the semiconductor substrate; a liner layer formed at least between the TSV and the semiconductor substrate; an ILD layer formed over the front surface of the semiconductor substrate; and an interconnect structure having a first partition and a second partition, the first partition formed in the ILD layer and the second partition formed in a portion of the semiconductor substrate, wherein the interconnect structure electrically connects the TSV to the semiconductor substrate. The package structure further comprises a semiconductor chip; and a plurality of bonding pads bonding the semiconductor chip to the interposer.

According to yet another embodiment, a semiconductor package structure comprises an interposer having: a semiconductor substrate having a front surface and a back surface opposite the front surface; a TSV formed extending from the front surface of the semiconductor substrate into the semiconductor substrate; a liner layer formed at least between the TSV and the semiconductor substrate; an ILD layer formed over the front surface of the semiconductor substrate; and an interconnect structure having a first partition and a second partition, the first partition formed in the ILD layer and the second partition formed in a portion of the semiconductor substrate. Wherein the interconnect structure electrically connects the TSV to the semiconductor substrate. The package structure further comprises a multi-chip semiconductor structure having at least a first chip and a second chip; and a plurality of bonding pads bonding the semiconductor structure to the interposer.

One or more of the embodiments of the present disclosure discussed above have advantages over existing methods. It is understood, however, that other embodiments may have different advantages, and that no particular advantage is required for all embodiments.

One of the advantages is that as TSV 55 is grounded (e.g., TSV 55 is electrically connected to substrate 30), cross coupling and cross talk between adjacent TSVs can be minimized. By having the TSVs grounded, resistive-capacitive delays that hinder further increasing of speed in microelectronic integrated circuits are minimized and signal integrity is thereby improved. Further, as an added benefit, a grounded TSV provides for better heat dissipation, especially in microelectronic ICs having smaller and smaller feature sizes. As a further advantage by grounding the TSV, charge build-up on electrostatic discharge (ESD) sensitive integrated circuits from an ESD event is prevented, thus reducing damage to the integrated circuit.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method of forming a semiconductor device, comprising:
   providing a semiconductor substrate, the semiconductor substrate having a first side and a second side opposite the first side;
   forming a through-silicon via (TSV) opening extending from the first side of the semiconductor substrate into the semiconductor substrate;
   forming a liner layer on the first side of the semiconductor substrate and along the sidewalls and bottom of the TSV opening;
   depositing a first conductive material layer over the liner layer in the opening to form a TSV;

forming an inter-layer dielectric (ILD) layer over the first side of the semiconductor substrate;
forming a via opening extending from the ILD layer into a portion of the semiconductor substrate;
forming a trench opening in the ILD layer to expose a portion of the TSV; and
depositing a second conductive material layer in the via and the trench openings to form an interconnect structure, the interconnect structure electrically connecting the TSV with the semiconductor substrate.

2. The method of claim 1, wherein the semiconductor device is an interposer.

3. The method of claim 1, after the forming the TSV, further comprising planarizing the first side of the semiconductor substrate.

4. The method of claim 1, further comprising forming a first barrier layer between the liner layer and the TSV.

5. The method of claim 4, further comprising forming a first seed layer between the first barrier layer and the TSV.

6. The method of claim 1, before the forming the ILD layer over the first side of the semiconductor substrate, further comprising forming an etch stop layer.

7. The method of claim 1, further comprising forming a second barrier layer over the via and trench openings.

8. The method of claim 7, further comprising forming a second seed layer over the second barrier layer.

9. The method of claim 1, wherein the interconnect structure is formed by electro-chemical plating.

10. The method of claim 1, wherein the TSV and interconnect structure comprise copper or copper alloys.

11. The method of claim 1, after the forming the interconnect structure, further comprising planarizing the first side of the semiconductor substrate.

12. A method of forming an interposer, comprising:
providing a semiconductor substrate, the semiconductor substrate having a front surface and a back surface opposite the front surface;
forming one or more through-silicon vias (TSVs) extending from the front surface into the semiconductor substrate;
forming an inter-layer dielectric (ILD) layer overlying the front surface of the semiconductor substrate and the one or more TSVs; and
forming an interconnect structure having a first partition and a second partition, the first partition formed in the ILD layer and the second partition formed in a portion of the semiconductor substrate, wherein the interconnect structure electrically connecting the one or more TSVs to the semiconductor substrate.

13. The method of claim 12, further comprising forming a liner layer between at least the one or more TSVs and the semiconductor substrate.

14. The method of claim 13, further comprising forming a barrier layer and/or a seed layer between the one or more TSVs and the liner layer.

15. The method of claim 12, further comprising forming a barrier layer and/or seed layer between at least the interconnect structure and the ILD layer and the front surface of the semiconductor substrate.

16. An integrated circuit structure, comprising:
a semiconductor substrate having a front surface and a back surface opposite the front surface;
a through-silicon via (TSV) formed extending from the front surface of the semiconductor substrate into the semiconductor substrate; and
an interconnect structure having a first partition and a second partition, the first partition formed in an inter-layer dielectric (ILD) layer, the ILD layer overlying the front surface of the semiconductor substrate, and the second partition formed in a portion of the semiconductor substrate, wherein the interconnect structure electrically connects the TSV to the semiconductor substrate.

17. The integrated circuit structure of claim 16, wherein the integrated circuit structure is an interposer.

18. The integrated circuit structure of claim 16, further comprising a liner layer formed at least between the TSV and the semiconductor substrate.

19. The integrated circuit structure of claim 18, further comprising:
a barrier layer formed between the TSV and the liner layer; and
a seed layer formed between the TSV and the barrier layer.

20. The integrated circuit structure of claim 16, wherein the interconnect structure and the TSV are formed of the same conductive material.

21. The integrated circuit structure of claim 17, wherein the interposer comprises passive devices.

22. The integrated circuit structure of claim 21, wherein the interposer comprises active devices.

23. An interposer, comprising:
a semiconductor substrate having a front surface and a back surface opposite the front surface;
a through-silicon via (TSV) formed extending from the front surface of the semiconductor substrate into the semiconductor substrate;
a liner layer formed at least between the TSV and the semiconductor substrate;
an inter-layer dielectric (ILD) layer formed over the front surface of the semiconductor substrate; and
an interconnect structure having a first partition and a second partition, the first partition formed in the ILD layer and the second partition formed in a portion of the semiconductor substrate, wherein the interconnect structure electrically connects the TSV to the semiconductor substrate.

24. The interposer of claim 23, further comprising a barrier layer formed between the TSV and the liner layer.

25. The interposer of claim 24, further comprising a seed layer formed between the TSV and the barrier layer.

26. The interposer of claim 23, wherein the interconnect structure and the TSV are formed of the same conductive material.

27. The interposer of claim 23, further comprising passive devices.

28. The interposer of claim 27, further comprising active devices.

29. A semiconductor package structure, comprising:
an interposer having:
a semiconductor substrate having a front surface and a back surface opposite the front surface;
a through-silicon via (TSV) formed extending from the front surface of the semiconductor substrate into the semiconductor substrate;
a liner layer formed at least between the TSV and the semiconductor substrate;
an inter-layer dielectric (ILD) layer formed over the front surface of the semiconductor substrate; and
an interconnect structure having a first partition and a second partition, the first partition formed in the ILD layer and the second partition formed in a portion of the semiconductor substrate, wherein the interconnect structure electrically connects the TSV to the semiconductor substrate;
a semiconductor chip; and a plurality of bonding pads bonding the semiconductor chip to the interposer.

30. The semiconductor package structure of claim 29, further comprising an additional semiconductor chip bonded onto the semiconductor chip.

31. The semiconductor package structure of claim 29, wherein the interposer comprises passive devices.

32. The semiconductor package structure of claim 31, wherein the interposer further comprises active devices.

33. A semiconductor package structure, comprising:
an interposer having:
  a semiconductor substrate having a front surface and a back surface opposite the front surface;
  a through-silicon via (TSV) formed extending from the front surface of the semiconductor substrate into the semiconductor substrate;
  a liner layer formed at least between the TSV and the semiconductor substrate;
  an inter-layer dielectric (ILD) layer formed over the front surface of the semiconductor substrate; and
  an interconnect structure having a first partition and a second partition, the first partition formed in the ILD layer and the second partition formed in a portion of the semiconductor substrate, wherein the interconnect structure electrically connects the TSV to the semiconductor substrate;
a multi-chip semiconductor structure having at least a first chip and a second chip; and
a plurality of bonding pads bonding the multi-chip semiconductor structure to the interposer.

34. The semiconductor package structure of claim 33, wherein the interposer comprises passive devices.

35. The semiconductor package structure of claim 34, wherein the interposer further comprises active devices.

* * * * *